United States Patent
Tsau

(10) Patent No.: US 7,952,891 B2
(45) Date of Patent: May 31, 2011

(54) ANTI-ELECTROMAGNETIC INTERFERENCE SHIELDING DEVICE

(75) Inventor: Chang-Jie Tsau, Taipei (TW)

(73) Assignee: EZCONN Corporation, Taipei (TW)

( * ) Notice: Subject to any disclaimer, the term of this patent is extended or adjusted under 35 U.S.C. 154(b) by 0 days.

(21) Appl. No.: 12/585,713

(22) Filed: Sep. 23, 2009

(65) Prior Publication Data

US 2011/0069469 A1    Mar. 24, 2011

(51) Int. Cl.
*H05K 9/00* (2006.01)
(52) U.S. Cl. .......... 361/818; 361/799; 361/816
(58) Field of Classification Search .......... 361/816, 361/818, 800, 752, 730, 796, 690, 797, 799, 361/756; 439/63, 581
See application file for complete search history.

(56) References Cited

U.S. PATENT DOCUMENTS 5,971,811 A * 10/1999 Mori et al. .......... 439/675
6,358,069 B2 * 3/2002 Yoshioka et al. .......... 439/108

* cited by examiner

*Primary Examiner* — Hung S Bui
(74) *Attorney, Agent, or Firm* — Rosenberg, Klein & Lee

(57) ABSTRACT

An anti-electromagnetic interference (anti-EMI) shielding device for fastening to a PC board is disclosed. The anti-EMI shielding device includes a frame having an upper lid closed onto an open top thereof, the frame including a plurality of side walls sequentially connected to one another to enclose a space therein and having a receiving hole formed on one of the side walls at a predetermined position; a connector including an annular ring portion, a body portion, and a tubular portion following the body portion, the annular ring portion being located at a front end of the connector for engaging with the receiving hole on the side wall of the frame; and a sealing structure forming a 360-degree sealing between the frame and the connector to effectively prevent electromagnetic wave from leaking out of and entering into the shielding device.

2 Claims, 4 Drawing Sheets

ANTI-ELECTROMAGNETIC INTERFERENCE SHIELDING DEVICE

FIELD OF THE INVENTION

The present invention relates to a shielding device, and more particularly to an anti-electromagnetic interference (anti-EMI) shielding device.

BACKGROUND OF THE INVENTION

FIG. 1A shows a conventional shielding device 10, which is soldered to a printed circuit (PC) board 15 to protect electronic circuits on the PC board 15 against electromagnetic interference (EMI), lest the electronic circuits should interfere with communication and human health. The shielding device 10 includes an upper lid 11 and a frame 12. The frame 12 has a connector 13 connected thereto for signal input and output. The frame 12 is provided at a predetermined position with a hole for engaging with an end portion of the connector 13, and the area of the connector 13 around the joint of the frame 12 and the connector 13 is riveted and compressed to ensure a firm connection between the two parts. However, the connection of the connector 13 to the frame 12 in the above-described manner will produce a clearance 14 between them, as shown in FIG. 1B. The clearance 14 very possibly forms a path via which electromagnetic wave enters into or leaks out of the shielding device 10. While the leakage of electromagnetic wave can be avoided by manually welding to seal the clearance 14, the welding will cause deformation of the frame 12 and requires additional time and labor costs.

SUMMARY OF THE INVENTION

A primary object of the present invention is to provide a shielding device that effectively prevents electromagnetic wave from leaking out of and entering into the shielding device.

To achieve the above and other objects, the anti-EMI shielding device according to the present invention is designed for fastening to a printed circuit board, and includes a frame having an upper lid closed onto an open top thereof, the frame including a plurality of side walls sequentially connected to one another to enclose a space therein and having a receiving hole formed on one of the side walls at a predetermined position; a connector including an annular ring portion, a body portion, and a tubular portion following the body portion, the annular ring portion being located at a front end of the connector for engaging with the receiving hole on the side wall of the frame; and a sealing structure forming a 360-degree sealing between the frame and the connector to effectively prevent electromagnetic wave from leaking out of and entering into the shielding device.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
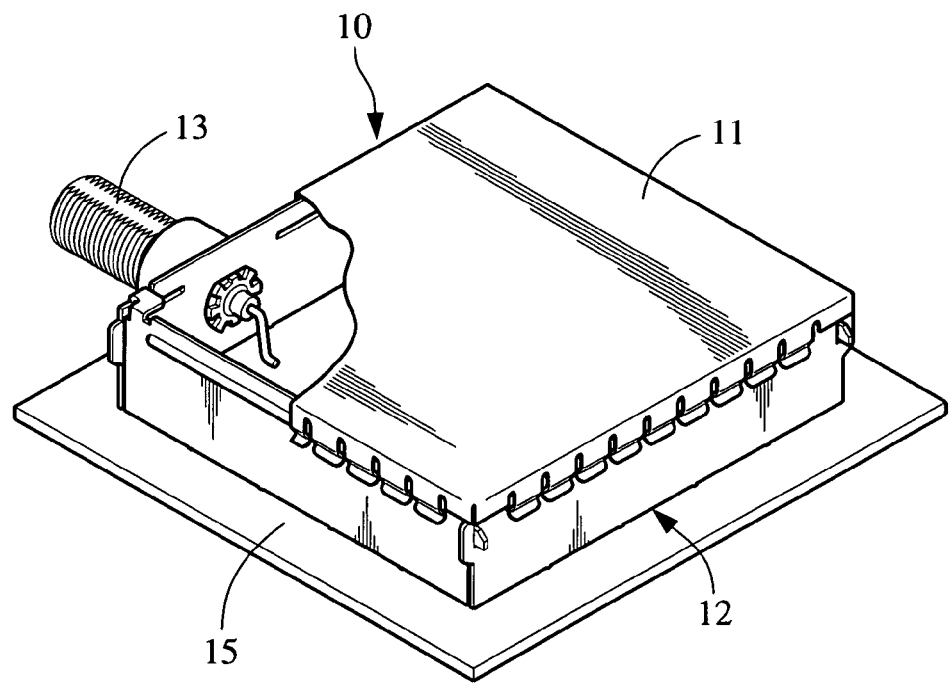
FIGS. 1A and 1B are assembled perspective view and fragmentary sectional view, respectively, of a conventional shielding device.
Figure 1B:
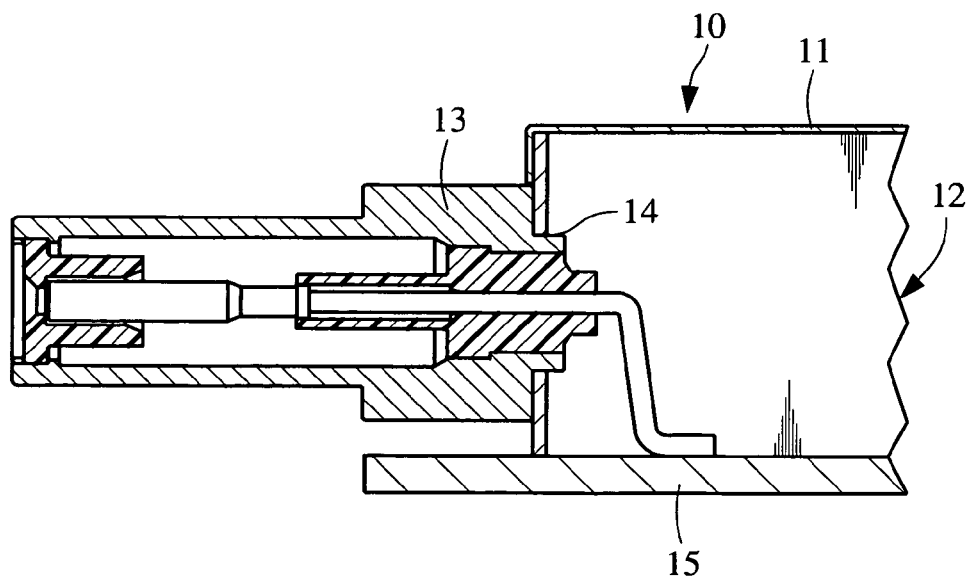
Figure 2:
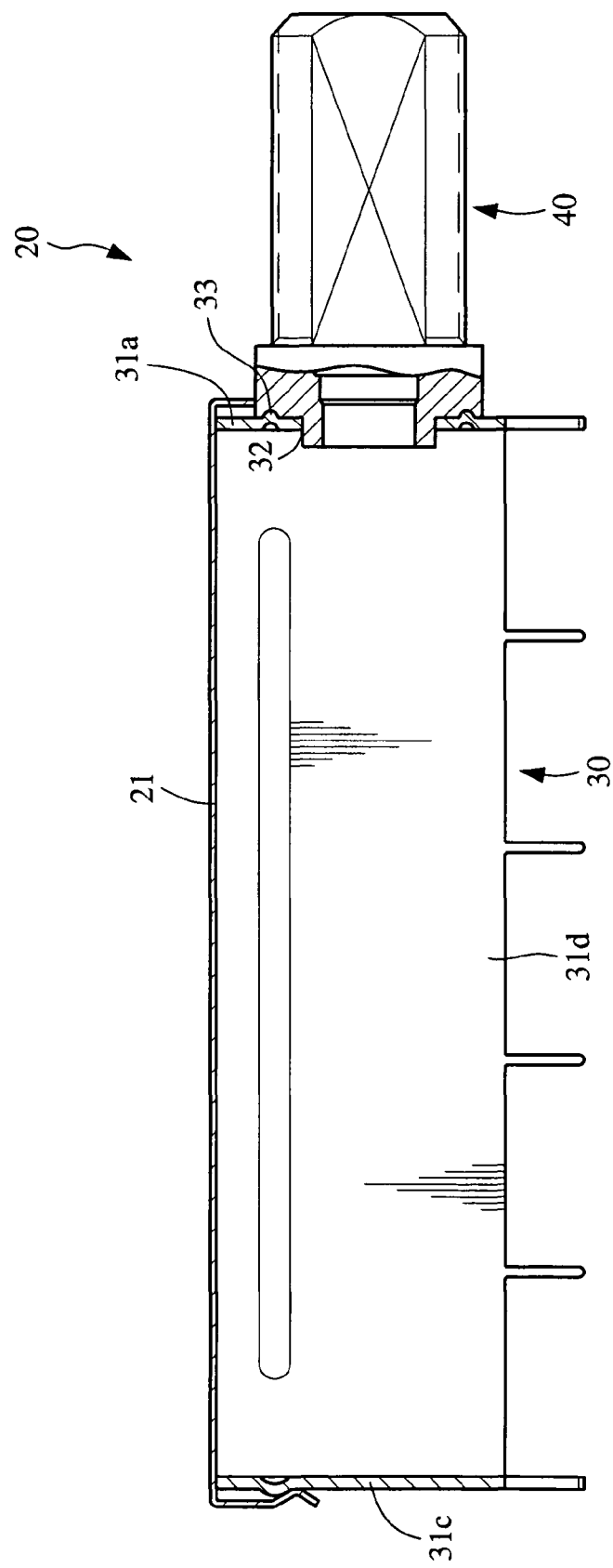
FIG. 2 is a partially sectioned side view of a shielding device according to an embodiment of the present invention.

Please refer to FIG. 2. An anti-electromagnetic interference (anti-EMI) shielding device 20 according to an embodiment of the present invention includes an upper lid 21 and a frame 30 for mounting on a printed circuit (PC) board. The frame 30 has a connector 40 connected thereto for signal input and output.

Figure 3:
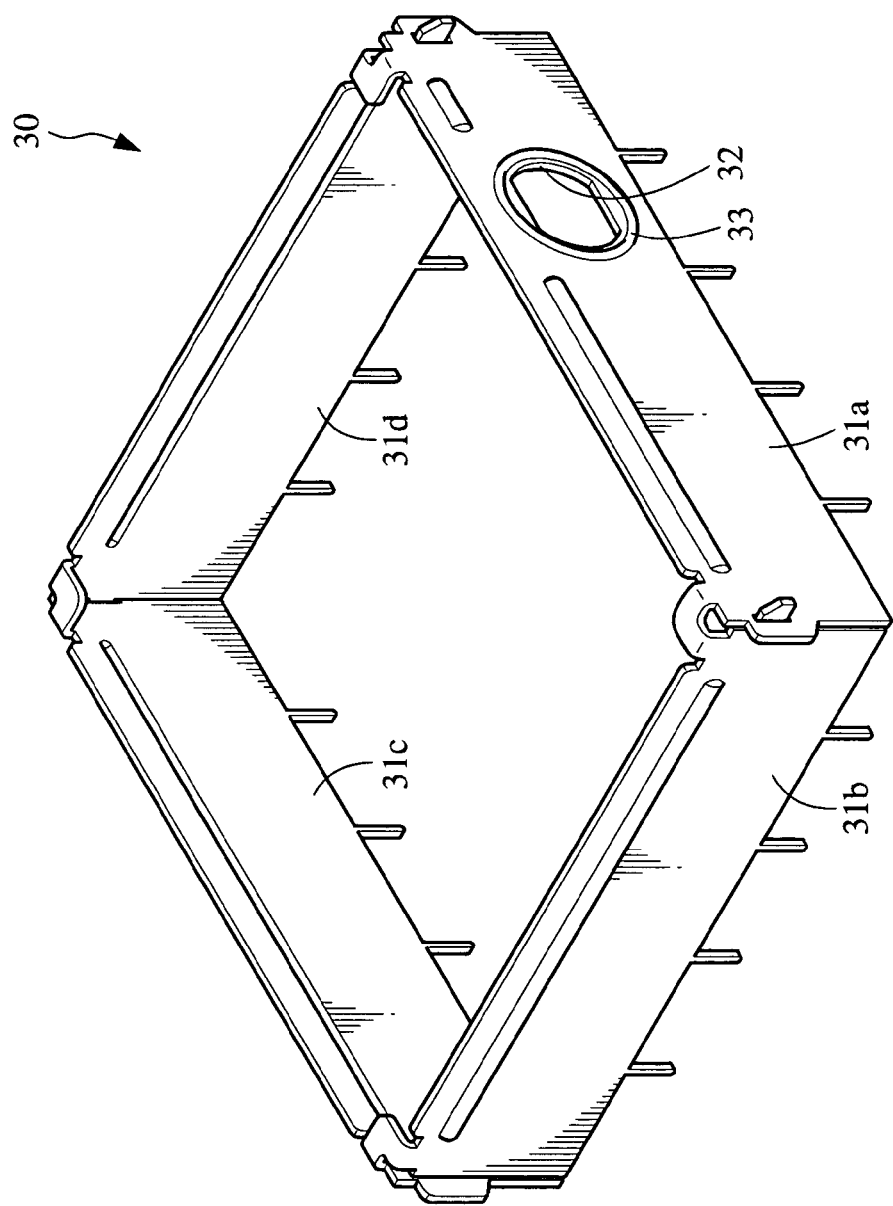
FIGS. 3 and 4 are perspective and sectioned side views, respectively, of a frame for the shielding device of the present invention.
Figure 4:
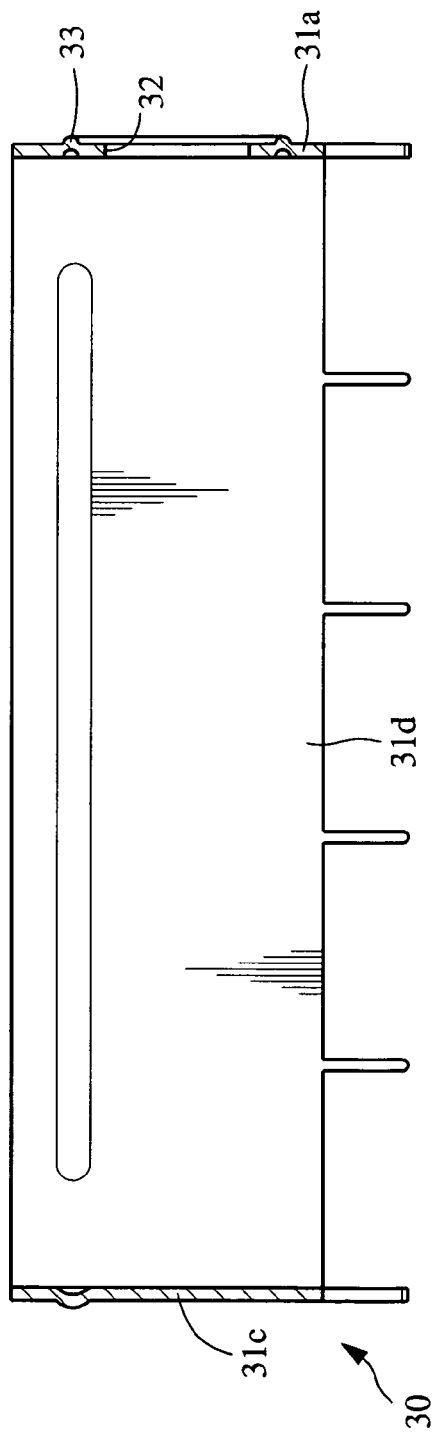

The frame 30 can have a configuration designed according to actual need. In the illustrated embodiment, the frame 30 is rectangular in shape, and the present invention will be described based on the illustrated embodiment. As shown in FIGS. 3 and 4, the frame 30 has four side walls, namely, a first, a second, a third, and a fourth side wall 31a, 31b, 31c, and 31d. On the first side wall 31a, there is provided a receiving hole 32.

Figure 6:
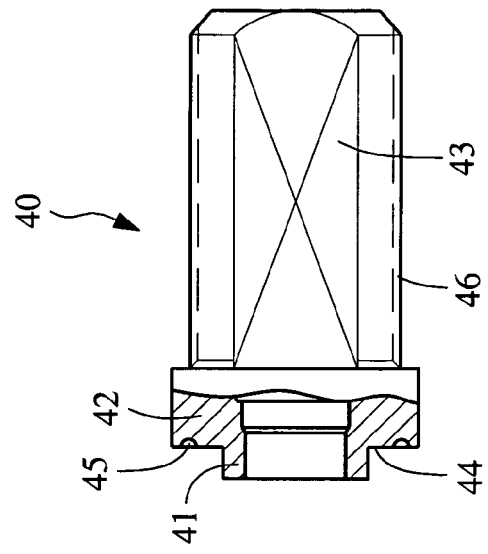
FIGS. 5 and 6 are cross-sectional and partially sectioned left side views, respectively, of a connector for the shielding device of the present invention.
Figure 5:
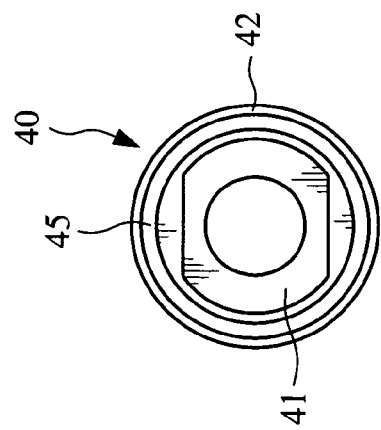

Please refer to FIGS. 5 and 6. The connector 40 includes an annular ring portion 41, a body portion 42, and a tubular portion 43. The annular ring portion 41 is located at a front end of the connector 40 for engaging with the receiving hole 32 on the frame 30.

The present invention is characterized in a 360-degree sealing structure provided between the frame 30 and the connector 40. The sealing structure includes an annular rib 33 formed around the receiving hole 32, and an annular groove 45 formed on the connector 40 corresponding to the annular rib 33. The annular groove 45 is located on a front end face 44 of the body portion 42 of the connector 40 around the annular ring portion 41. Substantially, the annular groove 45 and the annular rib 33 have the same width. The tubular portion 43 of the connector 40 is provided with external threads 46, which extend a full length of the tubular portion 43. Therefore, a mating connector (not shown) can be screwed to the tubular portion 43 to achieve mechanical and electrical connection between the mating connector and the connector 40.

When the annular ring portion 41 of the connector 40 is engaged with the receiving hole 31 on the frame 30, the annular rib 33 on the frame 30 will fitly extend into the annular groove 45 on the connector 40 to provide a 360-degree sealing between the frame 30 and the connector 40 to effectively prevent electromagnetic wave from leaking out of or entering into the shielding device 20. Finally, the annular ring portion 41 of the connector 40 is riveted and compressed to ensure firm and stable connection of the frame 30 to the connector 40.

The present invention has been described with a preferred embodiment thereof and it is understood that many changes and modifications in the described embodiment can be carried out without departing from the scope and the spirit of the invention that is intended to be limited only by the appended claims.

What is claimed is:

1. An anti-electromagnetic interference (anti-EMI) shielding device for fastening to a PC board, comprising:

a frame having an upper lid closed onto an open top thereof; the frame including a plurality of side walls sequentially connected to one another to enclose a space therein, and having a receiving hole formed on one of the side walls at a predetermined position;

a connector including an annular ring portion, a body portion, and a tubular portion following the body portion; and the annular ring portion being located at a front end of the connector for engaging with the receiving hole on the side wall of the frame; and a tongue and groove sealing structure forming a 360-degree sealing between the frame and the connector.

2. The anti-EMI shielding device as claimed in claim 1, wherein the tongue and groove sealing structure includes an annular rib externally located around the receiving hole on the frame, and an annular groove provided on a front end face of the body portion of the connector corresponding to the annular rib, such that the annular rib is engaged with the annular groove to enable a sealed connection of the connector to the frame.

* * * * *